United States Patent [19]
Lee et al.

[11] Patent Number: 5,837,610
[45] Date of Patent: Nov. 17, 1998

[54] CHEMICAL MECHANICAL POLISHING (CMP) APPARATUS AND CMP METHOD USING THE SAME

[75] Inventors: Byoung-hun Lee, Suwon; Joon-hee Lee, Seoul, both of Rep. of Korea

[73] Assignee: Samsung Electronics Co., Ltd., Suwon, Rep. of Korea

[21] Appl. No.: 805,659

[22] Filed: Feb. 27, 1997

[30] Foreign Application Priority Data

Feb. 28, 1996 [KR] Rep. of Korea .................... 1996 5097

[51] Int. Cl.⁶ .................................. H01L 21/304
[52] U.S. Cl. .................... 438/692; 438/689; 438/690; 438/691; 438/692
[58] Field of Search ................... 438/689, 690, 438/691, 692

[56] References Cited

U.S. PATENT DOCUMENTS 3,979,239  9/1976  Walsh ........................................... 156/4
5,578,529  11/1996  Mullins ..................................... 437/228

*Primary Examiner*—R. Bruce Breneman
*Assistant Examiner*—Thomas W. Weingart
*Attorney, Agent, or Firm*—Jones & Volentine, L.L.P.

[57] ABSTRACT

A chemical mechanical polishing (CMP) apparatus for planarizing a semiconductor wafer includes a wafer carrier for loading and fixing a semiconductor wafer to be polished and a polishing platen rotating at a constant speed, disposed at a lower portion of the wafer carrier. A polishing pad is provided on an upper surface of the polishing platen, and is in contact with a surface of the semiconductor wafer. A spiral slurry feed line supplies a slurry solution to the polishing pad. An end of the spiral slurry feed line is provided with a plurality of nozzles and the spiral slurry feed line is connected to a deionized water feed line that is opened or closed by a valve. Accordingly, abrasives are prevented from being precipitated, and the slurry solution is uniformly supplied to the semiconductor wafer, to thereby enhance polishing uniformity.

8 Claims, 2 Drawing Sheets

CHEMICAL MECHANICAL POLISHING (CMP) APPARATUS AND CMP METHOD USING THE SAME

BACKGROUND OF THE INVENTION (1) Field of the Invention

The present invention relates to a chemical mechanical polishing (CMP) apparatus for planarizing a surface of a semiconductor wafer and a CMP method using the same, and more particularly, to a chemical mechanical polishing apparatus for supplying slurry solution through a spiral slurry feed line, and to a CMP method using the same.

(2) Description of the Related Art

As multilayer interconnection processes become practicable along with an increase in integration of an integrated circuit, the global planarization of an interlayer dielectric film becomes more important. As such, a planarization method using a CMP apparatus has been proposed. In such a CMP apparatus, a surface of a wafer is chemically and mechanically polished by mechanical components, using a polishing pad and abrasives, and chemical components in slurry solution.

FIG. 1 is a sectional view showing a conventional CMP apparatus. The conventional CMP apparatus includes a polish platen 11, which is rotatable and horizontally movable, and a wafer carrier 19. A semiconductor wafer 10 is fixed on the bottom side of the wafer carrier 19 by a retaining ring 17, and a polishing pad 13 facing a surface of the semiconductor wafer 10 is fixed on the entire surface of the polish platen 11. A slurry solution 15 is supplied to the polishing pad 13 through a slurry feed line 14.

FIG. 2 is a schematic view explaining a conventional method of polishing a semiconductor wafer using the CMP apparatus of FIG. 1. The same reference numerals refer to the same structural elements.

In operation, the wafer carrier 19 descends so that it contacts the polish platen 11. Thereafter, one surface of the semiconductor wafer 10 attached to the wafer carrier 19 is chemically and mechanically polished, using a slurry solution 15 supplied through the slurry feed line 14, and the polishing pad 13 on the polish platen 11, which is rotating at a high speed.

In the conventional CMP apparatus, the slurry solution 15 supplied through the slurry feed line 14 is supplied at a single point 12 of the polishing pad 13. The amount of slurry solution 15 transferred to the semiconductor wafer 10 from this single point 12 becomes non-uniform while polishing the semiconductor wafer 10, as shown in FIG. 2. As a result, the surface of the polished semiconductor wafer becomes non-uniform.

Also, in the conventional CMP apparatus, the slurry solution for polishing an oxide or silicon film is colloidal, and thus the characteristics of the slurry solution are relatively stable. However, the slurry solution for polishing a metal film includes alumina, and as such, the alumina is easily precipitated while polishing the metal film.

In light of the foregoing, there exists a need for a CMP apparatus that can prevent precipitation of abrasives included in the slurry solution, and that can supply a uniform amount of slurry solution to the semiconductor wafer.

SUMMARY OF THE INVENTION

To overcome one or more of the problems of the conventional art, an object of the present invention is to provide a chemical mechanical polishing (CMP) apparatus that can prevent precipitation of abrasives included in the slurry solution, and that can supply a uniform amount of slurry solution to the semiconductor wafer.

It is another object of the present invention to provide a CMP method using the novel CMP apparatus.

To accomplish the first object of the present invention, there is provided a chemical mechanical polishing (CMP) apparatus for planarizing a semiconductor wafer, comprising: a wafer carrier for loading and fixing a semiconductor wafer to be polished; a polishing platen rotating at a constant speed, disposed at a lower portion of the wafer carrier; a polishing pad provided on an upper surface of the polishing platen, being in contact with a surface of the semiconductor wafer; and a spiral slurry feed line for supplying a slurry solution to the polishing pad.

One end of the spiral slurry feed line is provided with a plurality of nozzles. Also, a cleaning solution feed line is connected to the spiral slurry feed line, and the flow of the cleaning solution is controlled by a valve. The cleaning solution may be, for example, deionized water.

To accomplish the second object of the present invention, there is provided a chemical mechanical polishing (CMP) method for planarizing a semiconductor wafer, comprising steps of: mounting the semiconductor wafer to be polished below a wafer carrier; continuously mixing a slurry solution through a spiral slurry feed line; wetting a polishing pad in contact with the semiconductor wafer by supplying the continuously mixed slurry solution from the spiral slurry feed line to the polishing pad; and polishing a surface of the semiconductor wafer in contact with the polishing pad while rotating the polishing pad at a constant speed.

During the wetting step, the slurry solution is supplied through a plurality of nozzles at one end of the spiral slurry feed line. In addition, one may connect a cleaning solution feed line to the spiral slurry feed line, with the flow of cleaning solution being controlled by a valve disposed in the cleaning solution feed line, to thereby mix the cleaning solution with the slurry solution.

According to the present invention, the CMP apparatus includes a cleaning solution or deionized water feed line and a spiral slurry feed line provided with a plurality of nozzles, to thereby prevent precipitation of abrasives included in the slurry solution, and to supply uniform amounts of slurry solution to the semiconductor wafer. Accordingly, polishing uniformity is greatly enhanced.

BRIEF DESCRIPTION OF THE DRAWINGS

The above objects and advantages of the present invention will become more apparent by describing in detail a preferred embodiment thereof with reference to the attached drawings, in which.

DETAILED DESCRIPTION OF THE INVENTION

Figure 1:
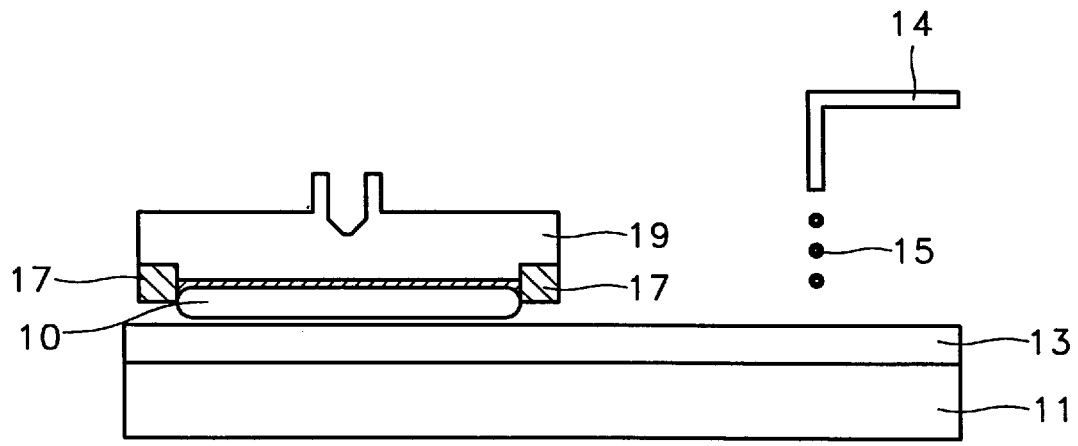
FIG. 1 is a sectional view showing a conventional chemical mechanical polishing (CMP) apparatus.
Figure 2:
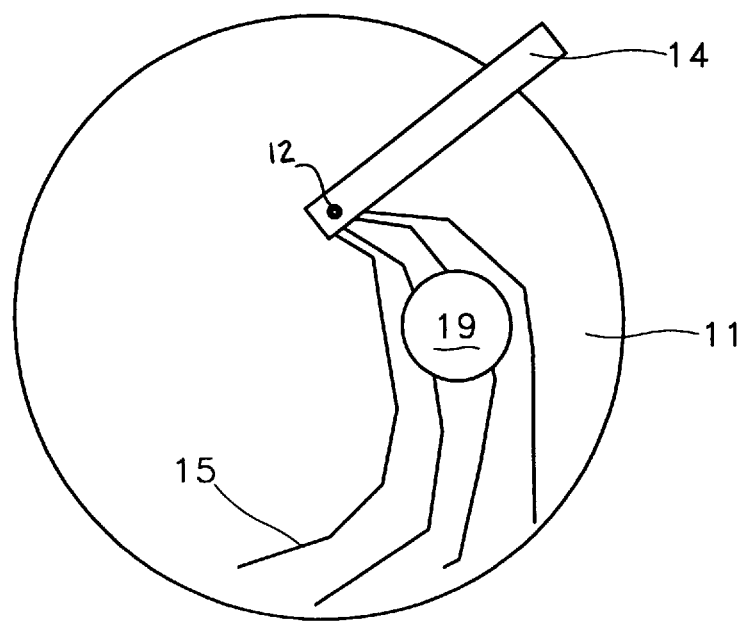
FIG. 2 is a schematic view for illustrating a method of polishing a semiconductor wafer using the CMP apparatus of FIG. 1.
Figure 3:
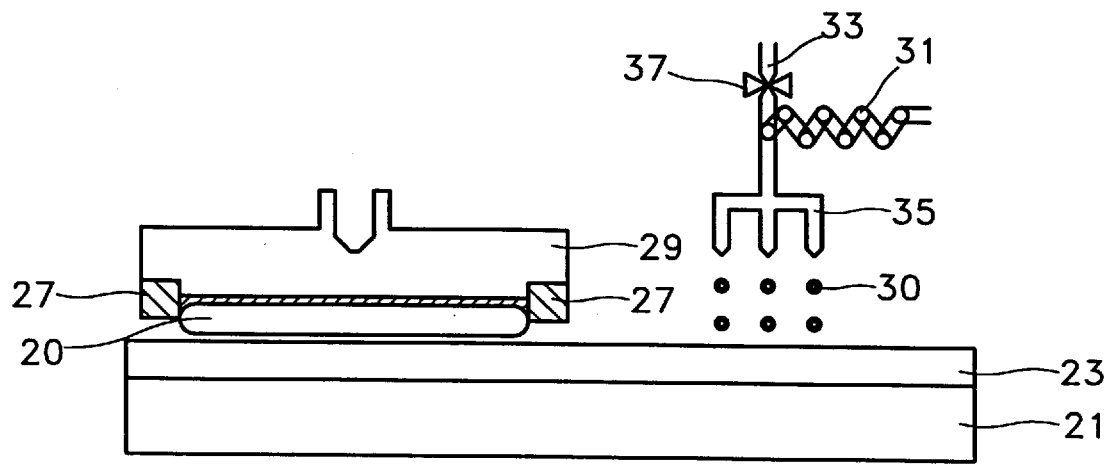
FIG. 3 is a sectional view illustrating a CMP apparatus according to the present invention.

Referring to FIG. 3, the chemical mechanical polishing (CMP) apparatus according to the present invention comprises a polish platen 21, which is rotatable and horizontally movable, and a wafer carrier 29. A semiconductor wafer 20 is fixed on the bottom side of the wafer carrier 29 by a retaining ring 27, and a polishing pad 23 facing one surface of the semiconductor wafer 20 is fixed on the entire surface of the polish platen 21. Located above the polishing pad 23 are a spiral slurry feed line 31 for supplying a slurry solution 30, a deionized water feed line 33 for supplying deionized water, and a valve 37 for controlling the deionized water supply.

Figure 4:
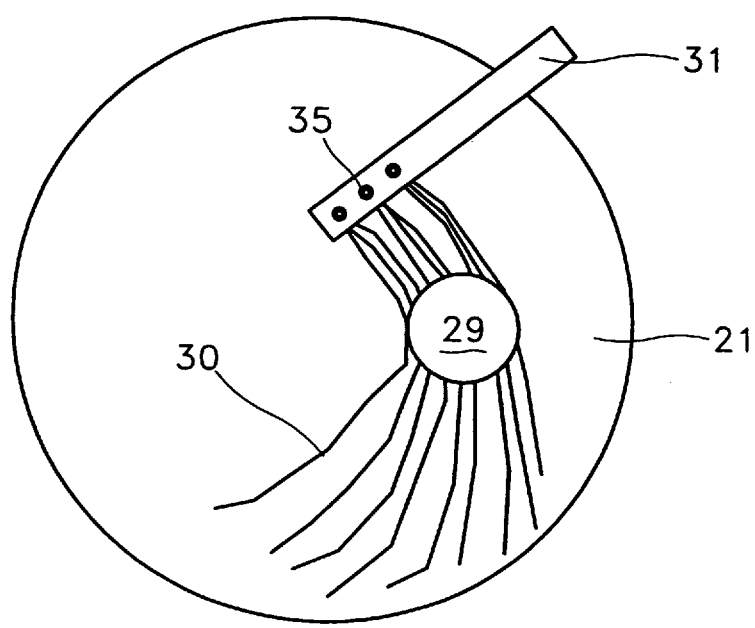
FIG. 4 is a schematic view showing a method of polishing a semiconductor wafer using the CMP apparatus of FIG. 3.

In the CMP apparatus of the present invention, a plurality of nozzles 35, for example, three nozzles, are provided at one end of the spiral slurry feed line 31 (see FIG. 4). Also, a slurry solution is continuously mixed through the spiral slurry feed line 31 to prevent precipitation of polishing components included in the slurry solution 30.

The CMP apparatus according to the present invention also includes the deionized water feed line 33 and the valve 37 for controlling the deionized water feed line 33, to thereby clean nozzles 35 in situ. Accordingly, precipitation of the slurry solution can be avoided by preventing condensation inside the nozzles 35. As a result, polish scratches are prevented that would have been caused by precipitation while conducting the polishing operations.

While deionized water is supplied through the deionized water feed line 33, the invention is not limited thereto, it being understood that in other embodiments, different chemical cleaning solutions can be supplied therethrough.

FIG. 4 is a schematic view for explaining a method of polishing a semiconductor wafer using the CMP apparatus of FIG. 3. Referring to FIG. 4, semiconductor wafer 20 to be polished is first mounted below a wafer carrier 29. Then, the wafer carrier 29 descends and contacts the polishing pad 23, which is rotating at a constant speed and is wetted by a slurry solution 30 supplied through a spiral slurry feed line 31. Thus one surface of the semiconductor wafer 20 is chemically and mechanically polished by the slurry solution 30, which is supplied through the spiral slurry feed line 31, and the polishing pad 23 of the polish platen 21 which rotates at a high speed.

As described above, one end of the spiral slurry feed line 31 includes a plurality of nozzles 35. The slurry solution 30 is supplied through the plurality (three in the illustrated embodiment of FIG. 4) of nozzles 35. Accordingly, a uniform amount of the slurry solution 30 (see FIG. 4) is supplied to the semiconductor wafer 20 attached to the wafer carrier 29. This uniform amount of the slurry solution 30 supplied to the semiconductor wafer 20 thus enhances polishing uniformity.

In addition, polishing uniformity is further enhanced by incorporating the deionized water feed line and the spiral slurry feed line with a plurality of nozzles. This prevents the precipitation of abrasives included in the slurry solution, and ensures a uniform supply of the slurry solution to the surface of the semiconductor wafer.

While this invention has been described in connection with what is presently considered to be the most practical and preferred embodiments, it is to be understood that the invention is not limited to the disclosed embodiment, but, on the contrary, it is intended to cover various modifications and equivalent arrangements included within the spirit and scope of the appended claims.

What is claimed is:

1. A chemical mechanical polishing (CMP) apparatus for planarizing a semiconductor wafer, comprising:

a wafer carrier for loading and fixing a semiconductor wafer to be polished;

a polishing platen rotating at a constant speed, disposed at a lower portion of said wafer carrier;

a polishing pad provided on an upper surface of said polishing platen, being in contact with a surface of said semiconductor wafer; and a spiral slurry feed line for supplying a slurry solution to said polishing pad.

2. The CMP apparatus according to claim 1, wherein one end of said spiral slurry feed line is provided with a plurality of nozzles.

3. The CMP apparatus according to claim 2, wherein said plurality of nozzles provided is three.

4. The CMP apparatus according to claim 1, further comprising:

a cleaning solution feed line connected to said spiral slurry feed line; and a valve disposed in said cleaning solution feed line for controlling a flow of cleaning solution therethrough.

5. The CMP apparatus according to claim 4, wherein said cleaning solution is deionized water.

6. A chemical mechanical polishing (CMP) method for planarizing a semiconductor wafer, comprising steps of:

mounting said semiconductor wafer to be polished below a wafer carrier;

continuously mixing a slurry solution through a spiral slurry feed line;

wetting a polishing pad in contact with said semiconductor wafer by supplying the continuously mixed slurry solution from the spiral slurry feed line to the polishing pad; and polishing a surface of said semiconductor wafer in contact with said polishing pad while rotating said polishing pad at a constant speed.

7. The CMP method according to claim 6, wherein during said wetting step, the slurry solution is supplied through a plurality of nozzles at one end of the spiral slurry feed line.

8. The CMP apparatus according to claim 6, further comprising steps of:

connecting a cleaning solution feed line to said spiral slurry feed line;

controlling a flow of cleaning solution in said cleaning solution feed line by a valve disposed therein; and mixing said cleaning solution with said slurry solution.

* * * * *